United States Patent
Byers et al.

(10) Patent No.: US 6,693,901 B1
(45) Date of Patent: Feb. 17, 2004

(54) BACKPLANE CONFIGURATION WITHOUT COMMON SWITCH FABRIC

(75) Inventors: Charles Calvin Byers, Aurora, IL (US); Stephen Joseph Hinterlong, Elburn, IL (US); Robert Allen Novotny, Naperville, IL (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/544,099

(22) Filed: Apr. 6, 2000

(51) Int. Cl.[7] ............................................. H04L 12/40
(52) U.S. Cl. ...................................... 370/362; 370/364
(58) Field of Search .................................. 370/396, 362, 370/389, 360, 364, 365

(56) References Cited

U.S. PATENT DOCUMENTS 5,388,102 A * 2/1995 Griffith et al.
5,625,780 A * 4/1997 Hsieh et al. ................. 395/311
6,587,470 B1 * 7/2003 Elliot et al. .................. 370/404

OTHER PUBLICATIONS

Cabletron Systems, *MMAC–Plus Installation Guide for Use with the 9C114 and 9C714 Chassis*, Copyright Mar. 1997, (See p. 3).

* cited by examiner

*Primary Examiner*—Kenneth Vanderpuye

(57) ABSTRACT

An electronic system for networking, switching or computing includes a backplane-based interconnection system (100). The system includes a backplane (102) with a plurality of traces coupled to slots for receiving circuit packs (104a–d). The backplane traces are configured to form point-to-point connections (106a–f) from one slot of the backplane to every other slot of the backplane. A hub circuit (110) is provided on each circuit pack for coupling the circuit pack to the point-to-point connections in the backplane. Circuit packs communicate via direct connections over the point-to-point connections or indirectly by sending traffic through point-to-point connections and hub circuits.

23 Claims, 5 Drawing Sheets

BACKPLANE CONFIGURATION WITHOUT COMMON SWITCH FABRIC

FIELD OF THE INVENTION

The present invention generally relates to large electronic systems, and in particular, to a telecommunications switching system configuration that does not require a common switch fabric board.

BACKGROUND OF THE INVENTION

Large electronic systems, as used in computing, data networking, and telecommunications elements often use a common backplane to provide high speed interconnection between several circuit boards, packs or modules that plug into slots in the backplane. The backplane is typically constructed of a multi-layer circuit board with conductive traces selectively routed to provide the high-speed interconnection. Connectors are provided on the backplane to couple circuit boards, packs, or modules which are held in place using a slotted chasis. The properties of these backplanes often have large influence over the capacity, performance, reliability, cost, and scale properties of electronic systems. Some backplane designs provide high capacity, while others provide low cost.

Currently, there are two predominant architectures for providing backplane transport infrastructures in high-speed telecommunications platforms, the bus and the fabric. These architectures both have limitations preventing the creation of a truly universal platform.

Bus-based backplanes use a large set of parallel signals, where each signal typically touches each slot and hence each board. This interconnection scheme is versatile and low cost, but imposes practical limits of a few billion bits per second on the maximum system throughput and also limits reliability. The total throughput must also be shared among all boards on the backplane. Buses are typically used in smaller systems that do not process large amounts of broadband traffic, or in systems with severe cost constraints. In particular, bus-based backplanes have a very low cost of common elements, and therefore permit low system costs, especially where a system is not equipped with all of its circuit cards or modules initially.

Fabric based systems use a central high-speed fabric or hub to switch traffic between all modules. High-speed point-to-point connections (either parallel or serial) are routed over a cable or backplane between each module and the central fabric, in a star topology. The central fabric can provide the large bandwidths (over 1 trillion bits per second) needed to support high-speed computing or broadband communications. Unfortunately, because the full central fabric, with support for the maximum number of connections, must be installed before any modules can be interconnected, the cost of such a system is often quite high, especially for partially equipped systems, where the large cost of the fabric is only amortized over a few modules.

Computing and telecommunications needs are increasing tremendously. In particular, high bandwidth systems are considered a necessity for distributed computing, networking and telecommunications switching. In light of the shortcomings of traditional bus-based backplane systems and central fabric-based systems, a need exists for a new paradigm in backplane-based systems that has the low cost of bus-based interconnect and the high capacity of central fabric-based interconnect.

SUMMARY OF THE INVENTION

An electronic interconnection system in accordance with the present invention includes a backplane. The backplane includes a multi-layer circuit board with a plurality of connectorized slots for connecting to traces routed in the backplane. Using the connectorized slots, circuit packs are coupled to the backplane and traces routed therein. To facilitate communication among the circuit packs coupled to the backplane, a hub circuit is provided on each circuit pack. In addition, point-to-point connections are provided from one slot in the backplane to each and every other slot in the backplane. The point-to-point connections are made using traces in the backplane. The hub circuits on each circuit pack couple to the point-to-point connections to facilitate control and routing over the communication links formed by the point-to-point connections.

The point-to-point connections formed in the backplane can be selectively routed between the slots, either physically or virtually, using the hub circuit to provide different connection topologies, capacity, and reliability. In one configuration, each slot includes a point-to-point connection to all other slots, creating a full mesh. For example, for a backplane with sixteen slots for circuit boards, each board has fifteen point-to-point connections, each terminating at a different slot. This configuration provides a direct point-to-point connection from any one circuit pack or module to another circuit pack or module. In addition, communication between circuit packs is readily facilitated by communication through another circuit pack, if for example, a point-to-point connection is faulty or unavailable. A myriad of other configurations are contemplated, including a ring configuration, wherein adjacent slots have point-to-point connections and slots at opposite ends are joined via point-to-point connections to complete the ring.

BRIEF DESCRIPTION OF THE PREFERRED EMBODIMENTS

Figure 1:
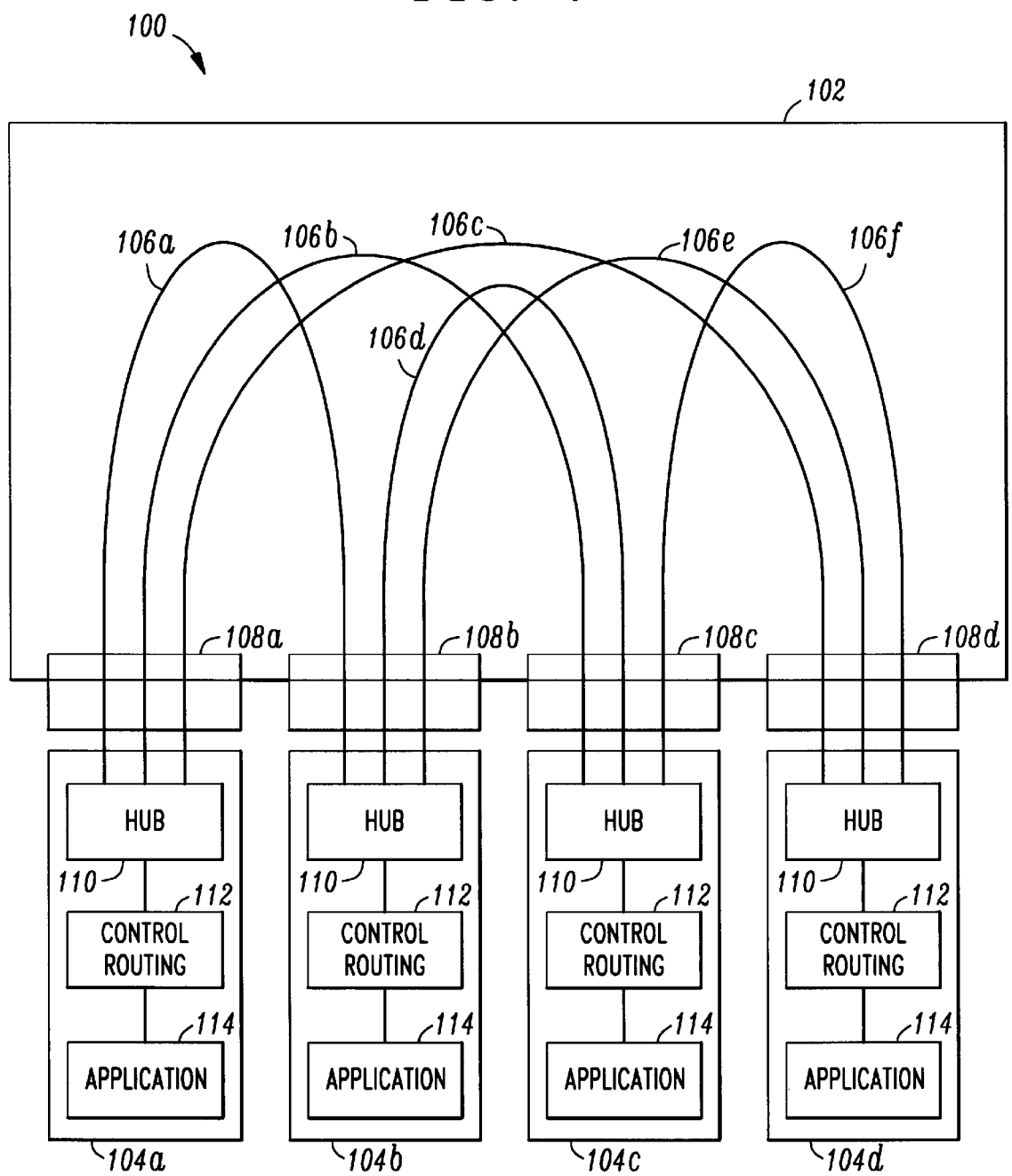
FIG. 1 is a block diagram of a backplane-based interconnection system in accordance with the present invention.

FIG. 1 is a block diagram of a backplane interconnection system 100 in accordance with the present invention. System 100 includes a backplane 102 and several circuit boards 104a–d. Backplane 102 provides intercommunication between circuit boards 104a–d. In particular, in accordance with the present invention, circuit boards 104a–d each have point-to-point connections 106a–f, which are used to route communications between circuit boards 104a–d.

Backplane 102 has slots 108a–d, which provide the interface for circuit packs 104a–d to couple to point-to-point connections 106a–f. Slots 108a–d are preferably connectors. Point-to-point connections 106a–f are formed by conductive traces formed in the multiple layers of backplane 102. In the preferred embodiment, the electrical properties of point-topoint connections 106a–f are implemented in accordance with the InfiniBand standard from the InfiniBand Trade Association, 5440 SW Westgate Drive, Suite 217, Portland, Oreg. 97221 (www.sysio.org). In accordance with the Infini-Band electrical signaling specification, point-to-point connections 106a–f are 2.5 gigabits per second bi-directional serial links over metallic conductors. As an alternative to InfiniBand, any suitable substitute point-to-point link technology can be used. Most preferably, the traces forming point-to-point connections 106a–f are routed as signal pairs with the signal pairs routed adjacent to each other on a single layer of the multi layer backplane, or on adjacent layers using identical conductor geometries. Most preferably, the layers adjacent to the layers carrying signal pairs are power or ground (that is, signal ground).

Each of the circuit boards 104a–d includes a hub circuit 110, a control/routing circuit 112 and an application circuit 114. Hub circuit 110 directly interfaces with point-to-point connections 106a–f to allow the circuit board to communicate over the point-to-point connections. Control/routing circuit 112 implements the protocol to control the routing over hub circuit 110 to the point-to-point connections 106a–f. Application circuit 114 includes the circuitry necessary to implement a particular application and interface that application to the interconnection system 100. For example, application circuit 114 may implement an access or line interface, such as ISDN or a feeder or trunk interface, such as T1, T3 or OC12. Also, application circuit 114 may implement a processing resource, a digital signal processor or another resource.

Although four circuits boards 104a–d are shown in FIG. 1 only the physical limitations of backplane 102 and point-to-point connections 106a–f limit the number of circuit boards in an interconnection system in accordance with the present invention. In a preferred embodiment, 16 slots are provided in backplane 102 and 240 point-to-point links are provided in backplane 102 to provide a point-to-point, full duplex connection between all 16 slots in the backplane.

Figure 2:
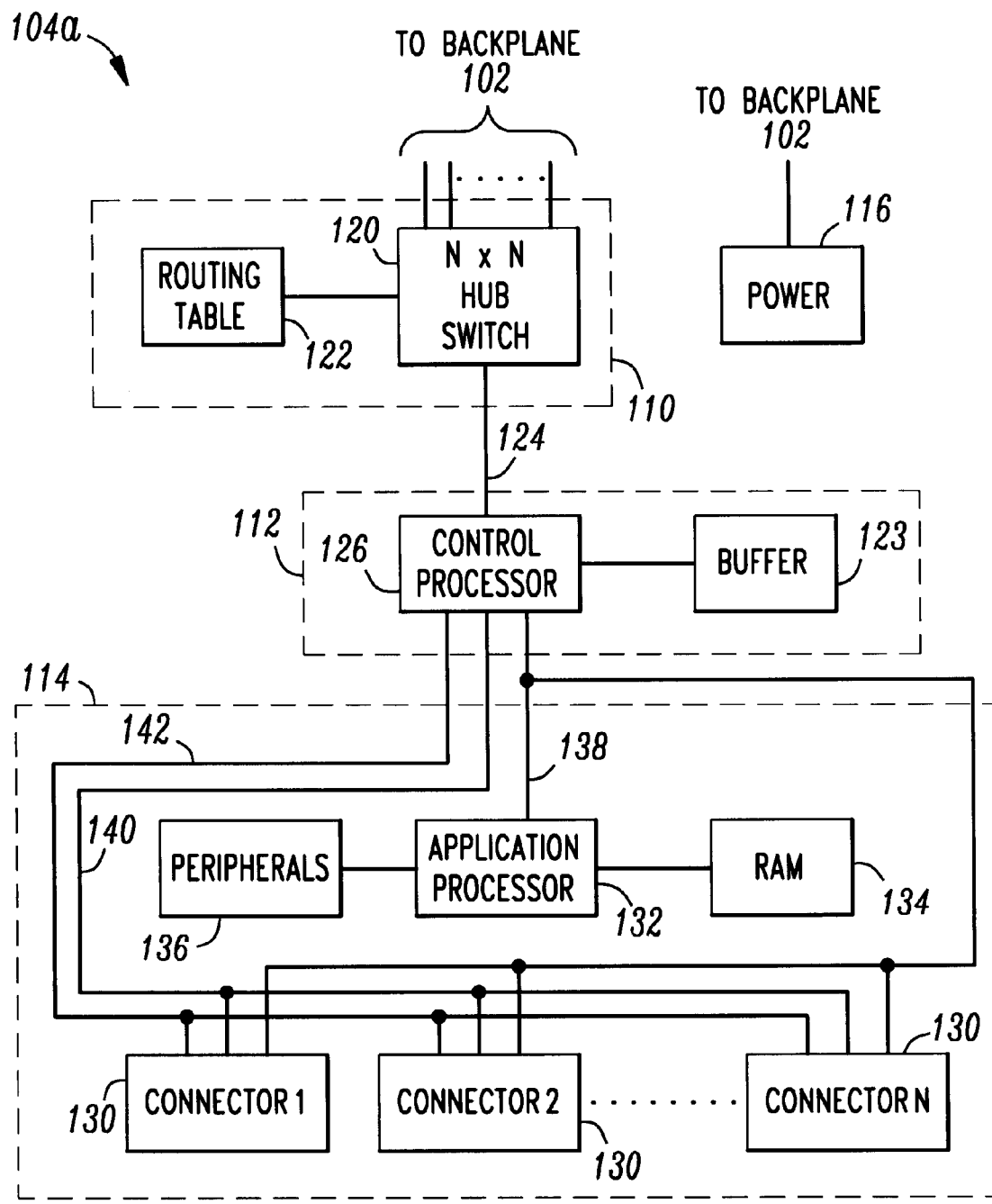
FIG. 2 is a block diagram of a circuit board for use in the backplane-based interconnection system shown in FIG. 1.

FIG. 2 is a block diagram showing circuit board 104a in additional detail. Circuit board 104a includes a power circuit 116, hub circuit 110, control/routing circuit 112 and application circuit 114. Power circuit 116 obtains power from backplane 102 and preferably conditions, converts and distributes that power to the components of circuit board 104a. Hub circuit 110, control/routing circuit 112 and application circuit 114 implement the functions described above and further below.

Hub circuit 110 preferably includes an N×N hub switch 120 and a routing table 122. Hub circuit 110 serves as a distributed fabric switch element. This is in contrast to a central fabric switch used in telecommunications systems in the prior art. N×N hub switch 120 couples circuit board 104a to N minus one point-to-point connections in the backplane. For system 100 shown in FIG. 1, N equals four. N×N hub switch 120 accepts and routes traffic to N links. Most preferably, one of the N links is circuit board 104a. The other links are the point to point connections to other hub circuits on circuit boards in other slots. N×N hub switch 120 has N minus one external links to point-to-point connections in backplane 102 and one internal link 124 coupled to control/routing circuit 112. Hub circuit 110 accepts traffic from the external links and routes it to the internal link. Also, hub circuit 110 receives communications from circuit board 104a over internal link 124 and routes the communication to one or more appropriate external links. A further function of hub circuit 110 is to accept traffic from one of the external links and route that traffic to some other of the external links without ever terminating that traffic on circuit board 104a. Routing table 122 is preferably a memory element that stores configuration information and other data related to the point-to-point connections coupled to hub circuit 110.

Control/routing circuit 112 provides some control over the communications implemented by hub circuit 110 and also interfaces application circuit 114 to hub circuit 110. Control/routing circuit 112 preferably includes a control processor 126 and a buffer 128. Control processor 126 is preferably any microprocessor, memory and necessary interface circuits. Control processor 126 preferably implements a host adapter function that provides low level control, buffering and priority management in an InfiniBand network. Also, control processor 126, which may be a network processor, preferably provides message and packet processing functions used for example in IP routing, asynchronous transfer mode (ATM) switching, and time slot interchange and protocol adaptation. Control processor 126 preferably translates and interfaces traffic from hub circuit 110 to the buses used on application circuit 114. For example, application circuit 114 may include one or more serial links, or busses, including an InfiniBand serial link, a PCI bus, the UTOPIA bus (used for asynchronous transfer mode cells), and the H.1X0 bus (used for synchronous timeslots). Buffer 128 is preferably a large RAM that stores packets, messages and other payloads being processed by control processor 126.

Application circuit 114 varies depending upon the application to be implemented. To facilitate flexibility and modularity, application circuit 114 includes several connectors 130 for receiving circuit board modules with varying functionality. Application circuit 114 includes an application processor 132, RAM 134, and peripherals 136. Application processor 132 uses RAM 134 and peripherals 136 to implement an application, for example, an access or trunk interface or a feeder interface in a telecommunications network. Application processor 132 is coupled to control processor 126 over bus 138. The preferred implementation for bus 138 is a standardized bus such as PCI or a serial link such as InfiniBand. Other standard interface buses 140, 142 are coupled to connectors 130 for application circuits utilizing those buses. Most preferably, connectors 130 are PCI mezzanine card sockets. In addition to the other functions listed above, application processor 132 preferably includes functions for bandwidth management, call processing or a general-purpose server.

Figure 3:
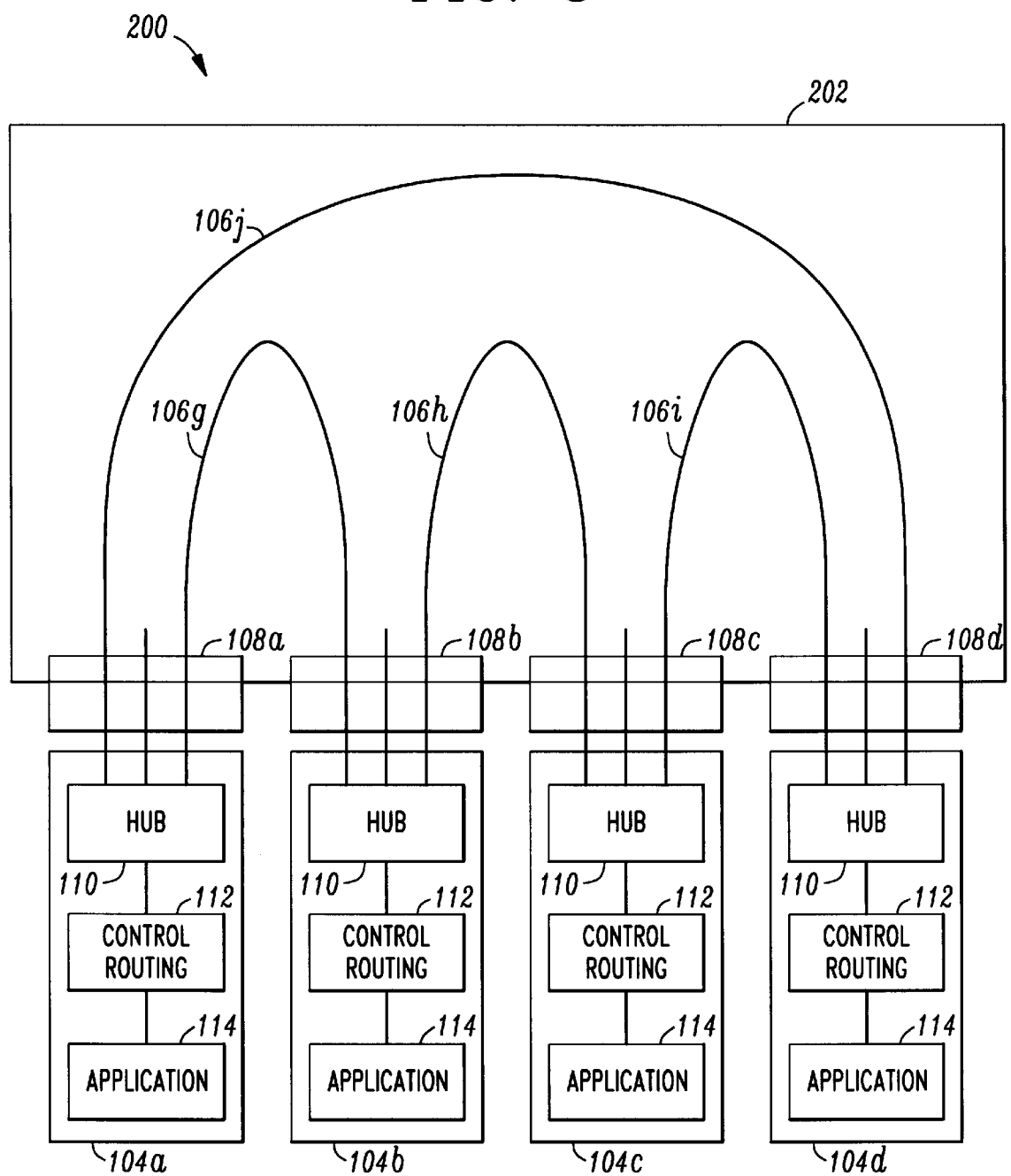
FIG. 3 is a block diagram of a backplane-based interconnection system in accordance with the present invention wherein circuit boards are connected in a ring topology.

FIG. 3 illustrates a backplane interconnection system 200 in accordance with the present invention. System 200 is similar in most respects to system 100 of FIG. 1, as noted by the reuse of the same reference numerals used to designate components of system 100. However, the point-to-point connections 106g–j in backplane 202 are configured differently from the point-to-point connections 106 a–f in backplane 102. In particular, the point-to-point connections 106g–j are selectively routed to form a ring configuration. In this ring configuration adjacent circuit boards have point-to-point connections to each other. For example, circuit board 104b has point-to-point connections 106g, 106h to adjacent circuit boards 104a and 104c. The two circuit boards at opposite ends of the system, circuit boards 104a and 104d, are considered to be adjacent and have a point-to-point connection 106j between them. Although illustrated in FIG. 3 as physical point-to-point connections, point-to-point connections 106g–j are alternatively virtual connections that may, for example, be implemented with direct or indirect connections, such as point-to-point connections 106a–f of FIG. 1.

Figure 4:
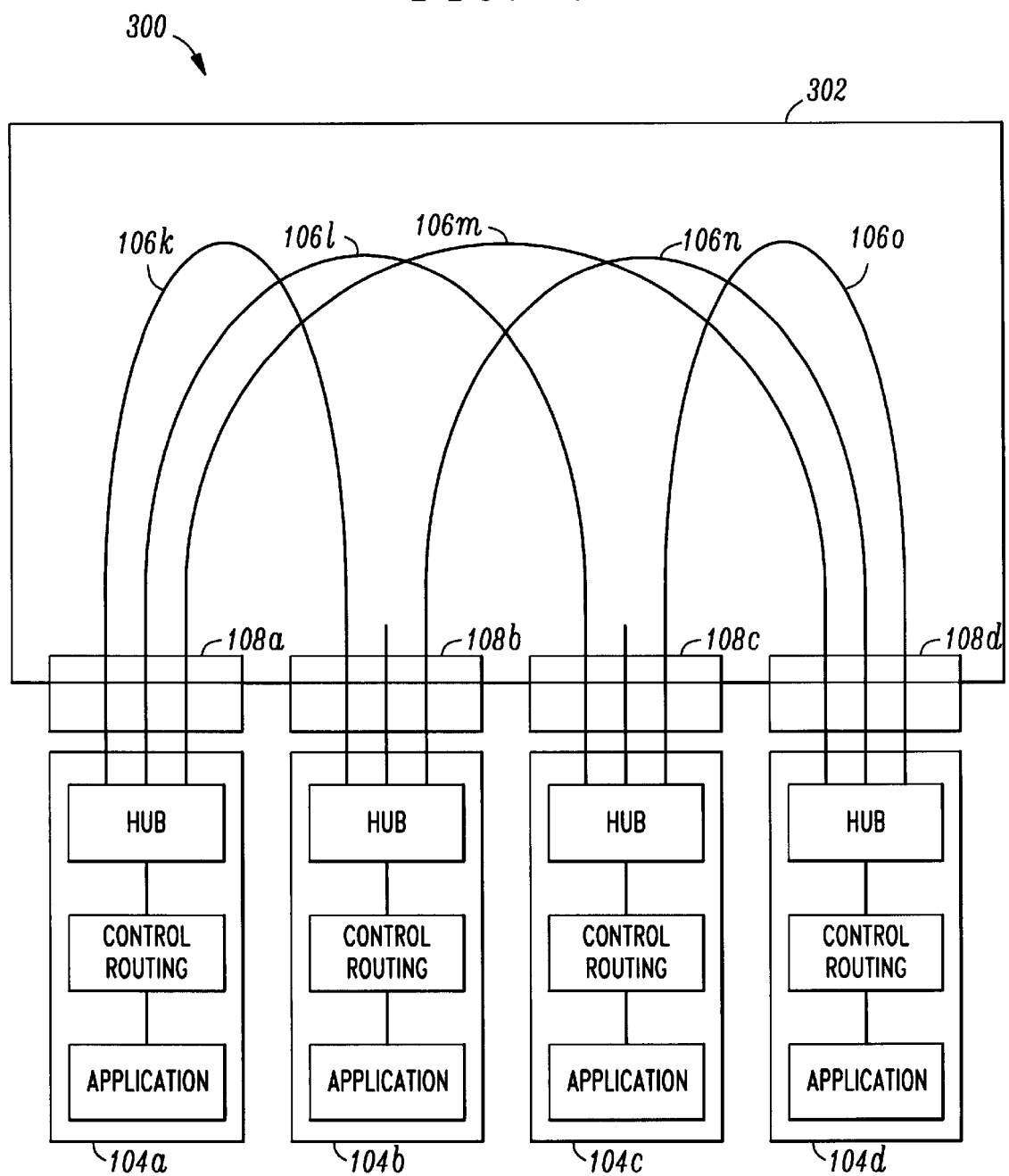
FIG. 4 is a block diagram of a backplane-based interconnection system in accordance with the present invention wherein circuit boards, are connected in a double star topology.

FIG. 4 illustrates a backplane interconnection system 300 in accordance with the present invention. System 300 is similar in most respects to system 100 of FIG. 1, as noted by the reuse of the same reference numerals used to designate components of system 100. However, the point-to-point connections 106k–o in backplane 202 are routed differently from the point-to-point connections 106a–f in backplane 102. In particular, the point-to-point connections 106k–o are selectively routed to form a double star configuration. In this double star configuration, two of circuit boards 104a–d are arbitrarily chosen to be central circuit boards. In FIG. 4, circuit boards 104a, 104d are used as central circuit boards. The circuit boards that are not central circuit boards, in this case circuit boards 104b, 104c, have point-to-point connections 106k, 106n, 106l, 106o to each of the central circuit boards, but no point-to-point connections to each other. The central circuit boards 104a, 104d have a point-to-point connection 106m between them. The point-to-point connections 106k–o may be virtual connections. An alternative to the double star configuration is a single star configuration, in which one circuit board is designated a central circuit board and every other circuit board has a point-to-point connection to the central circuit board, but no point-to-point connection to the other circuit boards.

Figure 5:
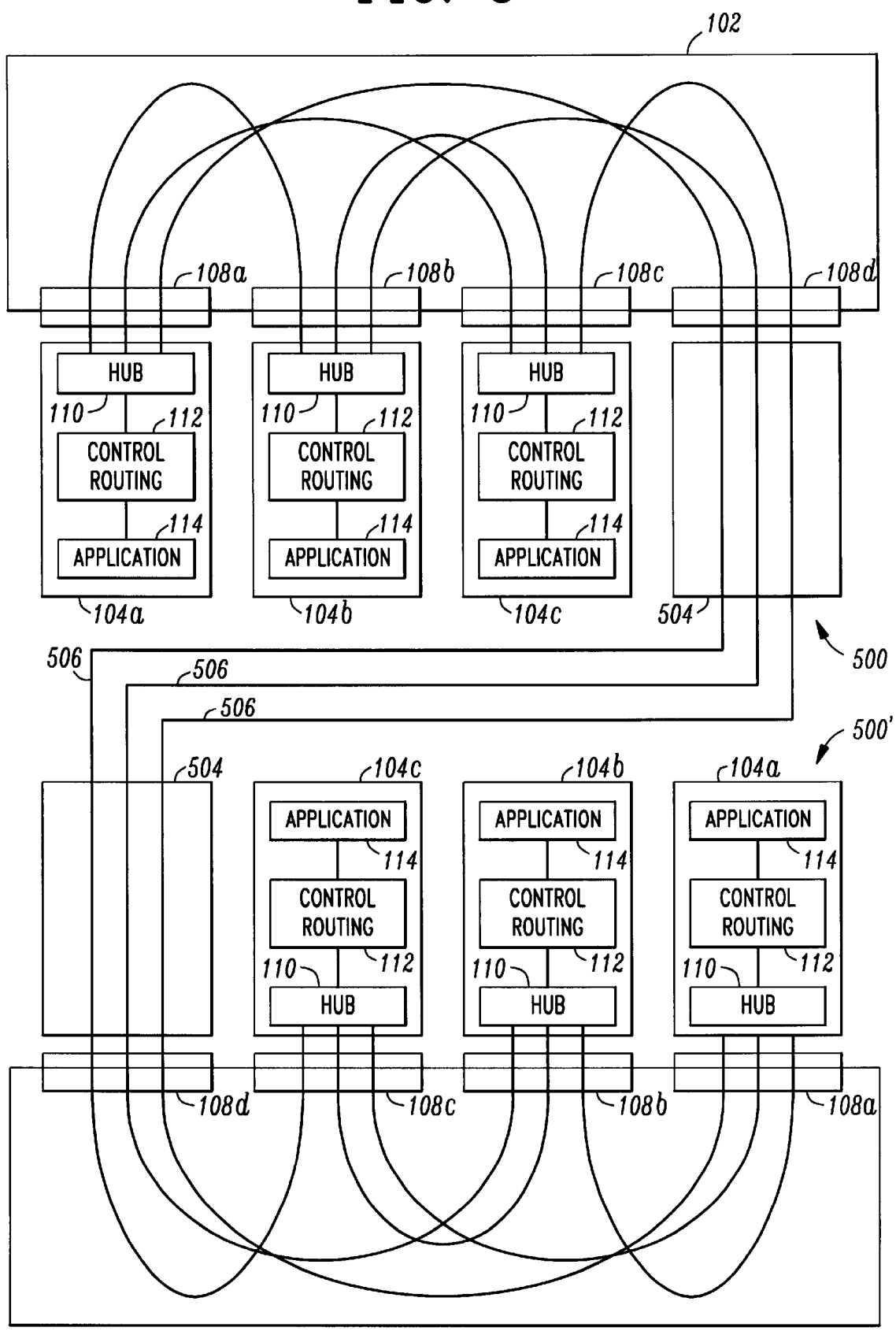
FIG. 5 is a block diagram of a backplane based interconnection system in accordance with the present invention wherein multiple backplanes are connected using extender boards.

FIG. 5 illustrates a configuration of two backplane interconnection systems in accordance with the present invention. One system is designated system 500 and the other system is designated 500'. Both systems 500, 500' include circuit boards 104a–c and backplanes 102 as shown and discussed above with respect to FIG. 1. In accordance with the present invention, system 500 and system 500' are coupled together for communication between the circuit boards on each system by extender boards 504. Extender boards 504 are coupled to backplanes 102 to extend the point-to-point connections in the backplanes 102. Preferably, extender boards 504 are passive circuit boards with traces routed therein to electrically extend the traces in the backplanes 102. One or more cables or connectors 506 are preferably used to electrically couple the systems 500, 500' to each other.

A myriad of systems may utilize the backplane interconnection system disclosed herein. One of many example systems is a universal gateway that provides conversions from one network to another network. In a universal gateway implemented using a backplane interconnection system in accordance with the invention, the application circuits may implement access circuits and digital signal processing circuits. For example, some application circuits may terminate access lines and long haul trunks. The interfaces utilized may include digital subscriber line (DSL) interfaces or OC12 trunk interfaces or other line or trunk interfaces. The digital signal processing circuits may be used for compression, decompression, encryption and decryption.

The present invention provides an interconnection system that includes a backplane with connectorized slots and a plurality of point-to-point connections between the slots. The point-to-point connections are controlled by hub circuits coupled to each slot of the backplane. The point-to-point connections and the distributed switching function provided by the hub circuit eliminate the need for a central fabric switching board. This advantageously reduces costs while not sacrificing bandwidth and capacity.

Whereas the present invention has been described with respect to specific embodiments thereof, it will be understood that various changes and modifications will be suggested to one skilled in the art and it is intended that the invention encompass such changes and modifications as fall within the scope of the appended claims.

What is claimed is:

1. An electronic system comprising:
   a backplane including a multi-layer circuit board with a plurality of traces and a plurality of slots for coupling to the plurality of traces;
   a plurality of circuit packs coupled to the plurality of slots such that one circuit pack of the plurality of circuit packs is coupled to one slot of the plurality of slots;
   wherein each circuit pack of the plurality of circuit packs includes a hub circuit to provide a plurality of hub circuits;
   wherein one hub circuit of the plurality of hub circuits has a point-to-point connection to another hub circuit of the plurality of hub circuits to facilitate communication between a first circuit pack with the one hub circuit and a second circuit pack with the another hub circuit; and
   wherein the point-to-point connection is made using at least some of the plurality of traces.

2. The system of claim 1 wherein the point-to-point connection comprises bi-directional serial links.

3. The system of claim 2 wherein the system comprises a telecommunications switching system.

4. The system of claim 1 wherein at least one circuit pack of the plurality of circuit packs includes a control/routing circuit that implements a protocol for communication between the one hub circuit and the another hub circuit.

5. The system of claim 4 wherein the at least one circuit pack further comprises an application circuit coupled to the control/routing circuit.

6. The system of claim 5 wherein the application circuit comprises at least one of an access interface, line interface, trunk interface, processing resource and digital signal processor.

7. The system of claim 5 wherein the application circuit includes a connector for receiving a module circuit.

8. An electronic system comprising:
   a backplane including a multi-layer circuit board with a plurality of traces and a plurality of slots for coupling to the plurality of traces;
   a plurality of circuit packs coupled to the plurality of slots such that one circuit pack of the plurality of circuit packs is coupled to one slot of the plurality of slots;
   wherein each circuit pack of the plurality of circuit packs includes a hub circuit to provide a plurality of hub circuits;
   a plurality of point-to-point connections between the plurality of hub circuits to facilitate communication between the plurality of hub circuits; and
   wherein the plurality point-to-point connections are made using at least some of the plurality of traces.

9. The system of claim 8 wherein the plurality of point-to-point connections comprise bi-directional serial links.

10. The system of claim 8 wherein each hub circuit of the plurality of hub circuits has a first point-to-point connection to a first adjacent hub circuit and a second point-to-point connection to a second adjacent hub circuit.

11. The system of claim 8 wherein at least one circuit pack of the plurality of circuit packs includes a control/routing circuit that implements a protocol for communication between the plurality of hub circuits.

12. The system of claim 11 wherein the at least one circuit pack further comprises an application circuit coupled to the control/routing circuit.

13. The system of claim 12 wherein the application circuit comprises at least one of an access interface, line interface, trunk interface, processing resource and digital signal processor.

14. The system of claim 12 wherein the application circuit includes a connector for receiving a module circuit.

15. The system of claim 8 wherein two circuit packs of the plurality of circuit packs are designated as central circuit packs and each hub circuit of the plurality of hub circuits that is not on the central circuit packs has a point-to-point connection to each of the central circuit packs.

16. An electronic system comprising:
a backplane including a multi-layer circuit board with a plurality of traces and a plurality of slots for coupling to the plurality of traces;
a plurality of circuit packs coupled to the plurality of slots such that one circuit pack of the plurality of circuit packs is coupled to one slot of the plurality of slots;
wherein each circuit pack of the plurality of circuit packs includes a hub circuit to provide a plurality of hub circuits;
wherein each hub circuit of the plurality of hub circuits communicates with another hub circuit of the plurality of hub circuits via a direct point-to-point connection between the each hub circuit and the another hub circuit or the each hub circuit communicates with the another hub circuit via at least one hub circuit of the plurality of hub circuits and at least two point-to-point connections; and
wherein the direct point-to-point connection and the at least two point-to-point connections are made using at least some of the plurality of traces.

17. The system of claim 16 wherein the direct point-to-point connection and the at least two point-to-point connections comprise bi-directional serial links.

18. The system of claim 16 wherein each circuit pack of the plurality of circuit packs includes a control/routing circuit that implements a protocol for communication between the plurality of hub circuits.

19. The system of claim 18 wherein the each circuit pack further comprises an application circuit coupled to the control/routing circuit.

20. The system of claim 19 wherein the application circuit comprises at least one of an access interface, line interface, trunk interface, processing resource and digital signal processor.

21. The system of claim 19 wherein the application circuit includes a connector for receiving a module circuit.

22. An electronic system comprising:
a first backplane and a second backplane, each of the first backplane and second backplane including a multi-layer circuit board with a plurality of traces and a plurality of slots for coupling to the plurality of traces;
a plurality of circuit packs coupled to the plurality of slots such that one circuit pack of the plurality of circuit packs is coupled to one slot of the plurality of slots;
wherein each circuit pack of the plurality of circuit packs includes a hub circuit to provide a plurality of hub circuits;
a plurality of point-to-point connections between the plurality of hub circuits to facilitate communication between the plurality of hub circuits;
wherein the plurality point-to-point connections are made using at least some of the plurality of traces;
a first extender circuit pack coupled to the first backplane to extend some extended traces of the plurality of traces of the first backplane;
a second extender circuit pack coupled to the second backplane to extend some extended traces of the plurality of traces of the second backplane; and
wherein the first extender circuit pack and the second extender circuit pack are coupled such that some extended traces of the plurality of traces of the first backplane are connected to some extended traces of the plurality of traces of the second backplane.

23. The system of claim 22 wherein the first extender circuit pack is coupled to the second extender circuit pack via a cable.

* * * * *